(12) United States Patent
Yoon et al.

(10) Patent No.: US 7,742,329 B2
(45) Date of Patent: Jun. 22, 2010

(54) WORD LINE TRANSISTOR STRENGTH CONTROL FOR READ AND WRITE IN SPIN TRANSFER TORQUE MAGNETORESISTIVE RANDOM ACCESS MEMORY

(75) Inventors: Sei Seung Yoon, San Diego, CA (US); Seung H Kang, San Diego, CA (US); Medi Hamidi Sani, Rancho Santa Fe, CA (US)

(73) Assignee: QUALCOMM Incorporated, San Diego, CA (US)

( * ) Notice: Subject to any disclaimer, the term of this patent is extended or adjusted under 35 U.S.C. 154(b) by 220 days.

(21) Appl. No.: 11/770,839

(22) Filed: Jun. 29, 2007

(65) Prior Publication Data
US 2008/0219043 A1 Sep. 11, 2008

Related U.S. Application Data

(60) Provisional application No. 60/893,217, filed on Mar. 6, 2007.

(51) Int. Cl.
*G11C 11/00* (2006.01)

(52) U.S. Cl. .................... 365/158; 365/173; 365/209

(58) Field of Classification Search ................ 365/158, 365/171, 173, 207, 209, 210.1
See application file for complete search history.

(56) References Cited

U.S. PATENT DOCUMENTS

| | | | |
|---|---|---|---|
| 6,034,887 A | 3/2000 | Gupta et al. | |
| 6,603,677 B2 | 8/2003 | Redon et al. | |
| 6,614,681 B2 | 9/2003 | Hidaka | |
| 6,763,471 B1 | 7/2004 | Aoyama | |
| 6,839,269 B2 | 1/2005 | Iwata et al. | |
| 6,862,232 B2 * | 3/2005 | Hanzawa et al. | 365/189.02 |
| 6,894,923 B2 | 5/2005 | Inaba | |
| 6,985,385 B2 | 1/2006 | Nguyen et al. | |
| 6,999,366 B2 | 2/2006 | Perner et al. | |
| 7,006,375 B2 | 2/2006 | Covington | |
| 7,009,877 B1 | 3/2006 | Huai et al. | |
| 7,016,220 B2 | 3/2006 | Lee et al. | |

(Continued)

FOREIGN PATENT DOCUMENTS

EP 1560221 8/2005

OTHER PUBLICATIONS

Hosomi M et al: "A Novel Nonvolatile Memory with Spin Torque Transfer Magnetization Switching: Spin-RAM" Electron Devices Meeting, 2005. IEDM Technical Digest, IEEE International Dec. 5, 2005, Piscataway, NJ, USA, IEEE, Dec. 5, 2005, pp. 459-462, XP010903510, ISBN: 978-0-7803-9268-7.

(Continued)

*Primary Examiner*—Tuan T Nguyen
*Assistant Examiner*—Toan Le
(74) *Attorney, Agent, or Firm*—Nicholas J. Pauley; Sam Talpalatsky; Peter M. Kamarchik

(57) ABSTRACT

Systems, circuits and methods for controlling word line voltage at a word line transistor in Spin Transfer Torque Magnetoresistive Random Access Memory (STT-MRAM) are disclosed. A first voltage can be supplied to the word line transistor for write operations. A second voltage, which is less than the first voltage, can be supplied to the word line transistor during read operations.

29 Claims, 6 Drawing Sheets

U.S. PATENT DOCUMENTS

| | | |
|---|---|---|
| 7,110,285 B2 | 9/2006 | Inaba |
| 7,187,577 B1 | 3/2007 | Wang et al. |
| 7,224,601 B2 | 5/2007 | Panchula |
| 7,245,522 B2 * | 7/2007 | Aoki .......................... 365/158 |
| 7,272,034 B1 | 9/2007 | Chen et al. |
| 7,272,035 B1 | 9/2007 | Chen et al. |
| 7,286,395 B2 | 10/2007 | Chen et al. |
| 7,289,356 B2 | 10/2007 | Diao et al. |
| 7,345,912 B2 | 3/2008 | Luo et al. |
| 7,394,684 B2 * | 7/2008 | Inokuchi et al. ............. 365/158 |
| 7,394,685 B2 | 7/2008 | Ooishi et al. |
| 7,430,135 B2 | 9/2008 | Huai et al. |
| 7,432,574 B2 | 10/2008 | Nakamura et al. |
| 7,436,699 B2 | 10/2008 | Tanizaki et al. |
| 2002/0105827 A1 | 8/2002 | Redon et al. |
| 2006/0221676 A1 | 10/2006 | Qian et al. |
| 2007/0268737 A1 * | 11/2007 | Hidaka ....................... 365/148 |
| 2007/0297223 A1 | 12/2007 | Chen et al. |

OTHER PUBLICATIONS

International Search Report—PCT/US08/056086, International Search Authority—European Patent Office—Jul. 15, 2008.

Written Opinion—PCT/US08/056086, International Search Authority—European Patent Office—Jul. 15, 2008.

Wang, Frank Z: "Diode-Free Magnetic Random Access Memory Using Spin-Dependent Tunneling Effect", Applied Physics Letters, AIP, American Institute of Physics, Melville, NY, vol. 77, No. 13, Sep. 25, 2000, pp. 2036-2038.

Debrosse et al., "A High-Speed 128-kb MRAM Core for Future Universal Memory Applications", IEEE Journal of Solid-State Circuits, vol. 39, No. 4, Apr. 2004, pp. 678-683.

Tang et al., "An IC Process Compatible Nonvolatile Magnetic Ram", Electron Devices Meeting, 1995, International, Dec. 10, 1995-Dec. 13, 1995, pp. 997-999.

Jeong et al., "A 0.24-μm 2.0-V 1T1MTJ 16-kb Nonvolatile Magnetoresistance RAM With Self-Reference Sensing Scheme", IEEE Journal of Solid-State Circuits, vol. 38, No. 11, Nov. 2003, pp. 1906-1910.

* cited by examiner

PARALLEL MAGNETIZATION
LOW RESISTANCE
STATE "0"

ANTIPARALLEL MAGNETIZATION
HIGH RESISTANCE
STATE "1"

READ & WRITE

WORD LINE TRANSISTOR STRENGTH CONTROL FOR READ AND WRITE IN SPIN TRANSFER TORQUE MAGNETORESISTIVE RANDOM ACCESS MEMORY

CLAIM OF PRIORITY UNDER 35 U.S.C. §119

The present Application for Patent claims priority to Provisional Application No. 60/893,217 entitled "WORD LINE TRANSISTOR STRENGTH CONTROL FOR READ AND WRITE IN SPIN TRANSFER TORQUE MAGNETORESISTIVE RANDOM ACCESS MEMORY" filed Mar. 6, 2007, and assigned to the assignee hereof and hereby expressly incorporated by reference herein.

FIELD OF DISCLOSURE

Embodiments of the invention are related to random access memory (RAM). More particularly, embodiments of the invention are related to word line transistor voltage control in Spin Transfer Torque Magnetoresistive Random Access Memory (STT-MRAM).

BACKGROUND

Random access memory (RAM) is a ubiquitous component of modern digital architectures. RAM can be stand alone devices or can be integrated or embedded within devices that use the RAM, such as microprocessors, microcontrollers, application specific integrated circuits (ASICs), system-on-chip (SoC), and other like devices as will be appreciated by those skilled in the art. RAM can be volatile or non-volatile. Volatile RAM loses its stored information whenever power is removed. Non-volatile RAM can maintain its memory contents even when power is removed from the memory. Although non-volatile RAM has advantages in the ability to maintain its contents without having power applied, conventional non-volatile RAM has slower read/write times than volatile RAM.

Magnetoresistive Random Access Memory (MRAM) is a non-volatile memory technology that has response (read/write) times comparable to volatile memory. In contrast to conventional RAM technologies which store data as electric charges or current flows, MRAM uses magnetic elements. As illustrated in FIGS. 1A and 1B, a magnetic tunnel junction (MTJ) storage element 100 can be formed from two magnetic layers 110 and 130, each of which can hold a magnetic field, separated by an insulating (tunnel barrier) layer 120. One of the two layers (e.g., fixed layer 110), is set to a particular polarity. The other layer's (e.g., free layer 130) polarity 132 is free to change to match that of an external field that can be applied. A change in the polarity 132 of the free layer 130 will change the resistance of the MTJ storage element 100. For example, when the polarities are aligned, FIG. 1A, a low resistance state exists. When the polarities are not aligned, FIG. 1B, then a high resistance state exists. The illustration of MTJ 100 has been simplified and those skilled in the art will appreciate that each layer illustrated may comprise one or more layers of materials, as is known in the art.

Referring to FIG. 2A, a memory cell 200 of a conventional MRAM is illustrated for a read operation. The cell 200 includes a transistor 210, bit line 220, digit line 230 and word line 240. The cell 200 can be read by measuring the electrical resistance of the MTJ 100. For example, a particular MTJ 100 can be selected by activating an associated transistor 210, which can switch current from a bit line 220 through the MTJ 100. Due to the tunnel magnetoresistive effect, the electrical resistance of the MTJ 100 changes based on the orientation of the polarities in the two magnetic layers (e.g., 110, 130), as discussed above. The resistance inside any particular MTJ 100 can be determined from the current, resulting from the polarity of the free layer. Conventionally, if the fixed layer 110 and free layer 130 have the same polarity, the resistance is low and a "0" is read. If the fixed layer 110 and free layer 130 have opposite polarity, the resistance is higher and a "1" is read.

Referring to FIG. 2B, the memory cell 200 of a conventional MRAM is illustrated for a write operation. The write operation of the MRAM is a magnetic operation. Accordingly, transistor 210 is off during the write operation. Current is propagated through the bit line 220 and digit line 230 to establish magnetic fields 250 and 260 that can affect the polarity of the free layer of the MTJ 100 and consequently the logic state of the cell 200. Accordingly, data can be written to and stored in the MTJ 100.

MRAM has several desirable characteristics that make it a candidate for a universal memory, such as high speed, high density (i.e., small bitcell size), low power consumption, and no degradation over time. However, MRAM has scalability issues. Specifically, as the bit cells become smaller, the magnetic fields used for switching the memory state increase. Accordingly, current density and power consumption increase to provide the higher magnetic fields, thus limiting the scalability of the MRAM.

Unlike conventional MRAM, Spin Transfer Torque Magnetoresistive Random Access Memory (STT-MRAM) uses electrons that become spin-polarized as the electrons pass through a thin film (spin filter). STT-MRAM is also known as Spin Transfer Torque RAM (STT-RAM), Spin Torque Transfer Magnetization Switching RAM (Spin-RAM), and Spin Momentum Transfer (SMT-RAM). During the write operation, the spin-polarized electrons exert a torque on the free layer, which can switch the polarity of the free layer. The read operation is similar to conventional MRAM in that a current is used to detect the resistance/logic state of the MTJ storage element, as discussed in the foregoing. As illustrated in FIG. 3A, a STT-MRAM bit cell 300 includes MTJ 305, transistor 310, bit line 320 and word line 330. The transistor 310 is switched on for both read and write operations to allow current to flow through the MTJ 305, so that the logic state can be read or written.

Referring to FIG. 3B, a more detailed diagram of a STT-MRAM cell 301 is illustrated, for further discussion of the read/write operations. In addition to the previously discussed elements such as MTJ 305, transistor 310, bit line 320 and word line 330, a source line 340, sense amplifier 350, read/write circuitry 360 and bit line reference 370 are illustrated. As discussed above, the write operation in an STT-MRAM is electrical. Read/write circuitry 360 generates a write voltage between the bit line 320 and the source line 340. Depending on the polarity of the voltage between bit line 320 and source line 340, the polarity of the free layer of the MTJ 305 can be changed and correspondingly the logic state can be written to the cell 301. Likewise, during a read operation, a read current is generated, which flows between the bit line 320 and source line 340 through MTJ 305. When the current is permitted to flow via transistor 310, the resistance (logic state) of the MTJ 305 can be determined based on the voltage differential between the bit line 320 and source line 340, which is compared to a reference 370 and then amplified by sense amplifier 350. Those skilled in the art will appreciate the operation and construction of the memory cell 301 is known in the art. Additional details are provided, for example, in M. Hosomi, et al., A Novel Nonvolatile Memory with Spin Transfer Torque Magnetoresistive Magnetization Switching: Spin-RAM, proceedings of IEDM conference (2005), which is incorporated herein by reference in its entirety.

The electrical write operation of STT-MRAM eliminates the scaling problem due to the magnetic write operation in MRAM. Further, the circuit design is less complicated for STT-MRAM. However, because both read and write operations are performed by passing current through the MTJ 305, there is a potential for read operations to disturb the data stored in the MTJ 305. For example, if the read current is similar to or greater in magnitude than the write current threshold, then there is a substantial chance the read operation may disturb the logic state of MTJ 305 and thus degrade the integrity of the memory.

SUMMARY

Exemplary embodiments of the invention are directed to systems, circuits and methods for controlling the word line voltage applied to word line transistors in STT-MRAM.

Accordingly, an embodiment of the invention can include a Spin Transfer Torque Magnetoresistive Random Access Memory (STT-MRAM) comprising a bit cell having a magnetic tunnel junction (MTJ) and a word line transistor, wherein the bit cell is coupled to a bit line and a source line; and a word line driver coupled to a gate of the word line transistor, wherein the word line driver is configured to provide a first voltage for a write operation and a second voltage during a read operation, and wherein the first voltage is higher than the second voltage.

Another embodiment of the invention can include a method for read and write operations in a Spin Transfer Torque Magnetoresistive Random Access Memory (STT-MRAM) including applying a first voltage to a word line transistor of a bit cell during a write operation; and applying a second voltage to the word line transistor during a read operation, wherein the first voltage is higher than the second voltage.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Aspects of embodiments of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of embodiments of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

As discussed in the background, STT-MRAM uses a low write current for each cell, which is an advantage of this memory type over MRAM. However, cell read current can approach or be higher than the write current threshold and thus cause an invalid write operation to happen. To reduce the potential of an invalid write, embodiments of the invention use different word line (WL) voltage levels for read and write. Conventional designs apply the same WL voltage for read and write. At a given read current, the probability of an invalid write increases with the pulse width. Hence, a conventional design scheme uses a short pulse for read and a long pulse for write. In practice, this results in imbalance in read and write cycle times, often making the write cycle time unnecessarily longer than the read cycle time. In contrast, embodiments of the invention control the WL transistor strength for read and write operations. If the write cycle WL voltage level is higher than the read level, it can generate a higher write current. Those skilled in the art will appreciate that there are many ways to practice embodiments of the invention. For example, a pumping voltage can be used for the increased WL voltage level. Alternatively, an available power supply which is at a higher voltage than the core power supply of the memory can be used.

Figure 1A:
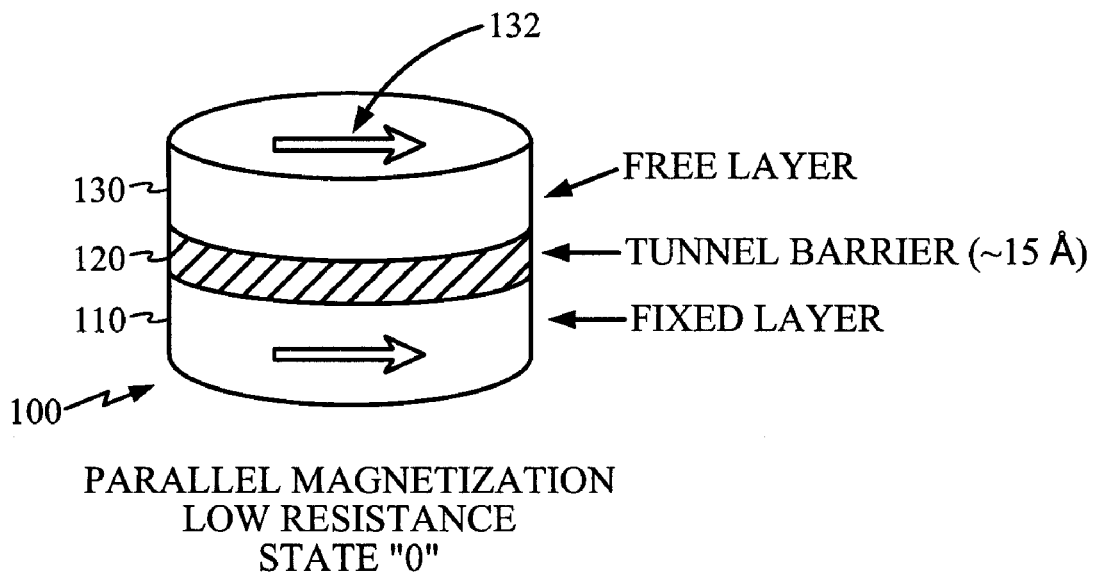
FIGS. 1A and 1B are illustrations of a magnetic tunnel junction (MTJ) storage element.
Figure 1B:
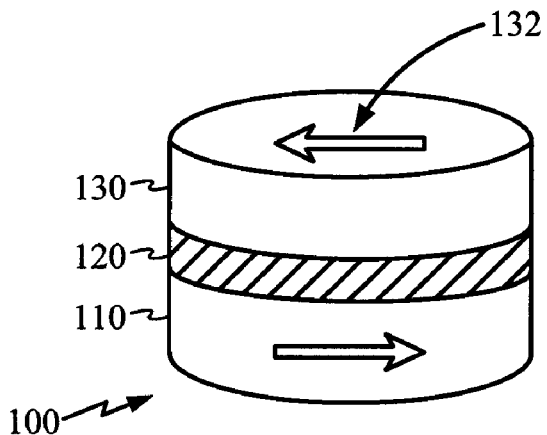
Figure 2A:
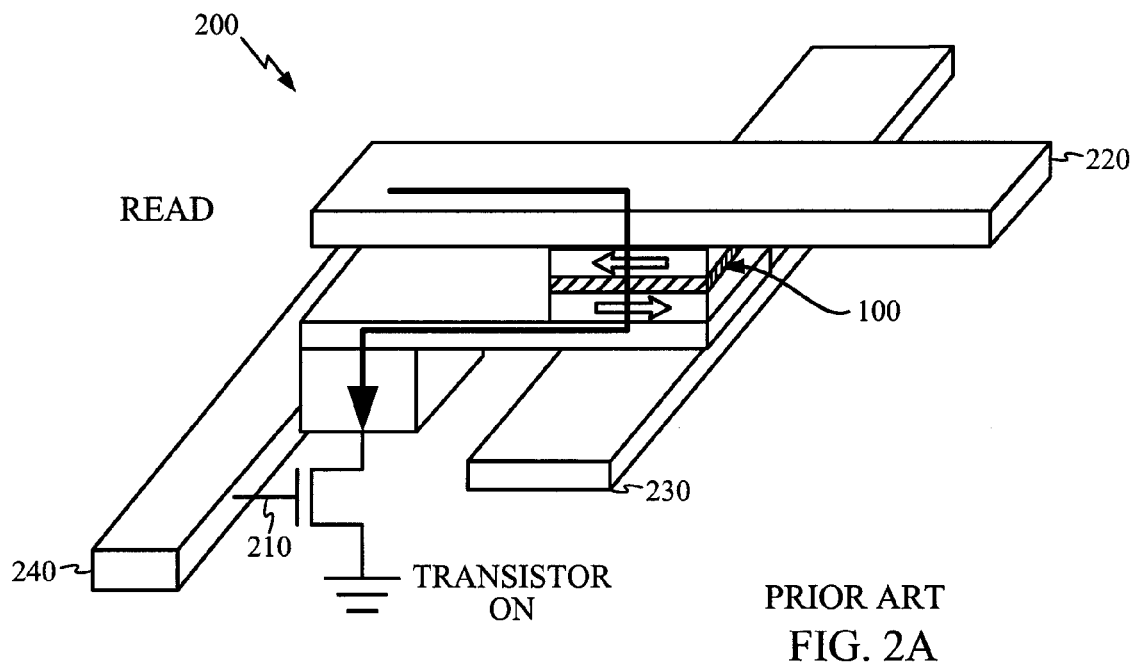
FIGS. 2A and 2B are illustrations of a Magnetoresistive Random Access Memory (MRAM) cell during read and write operations, respectively.
Figure 2B:
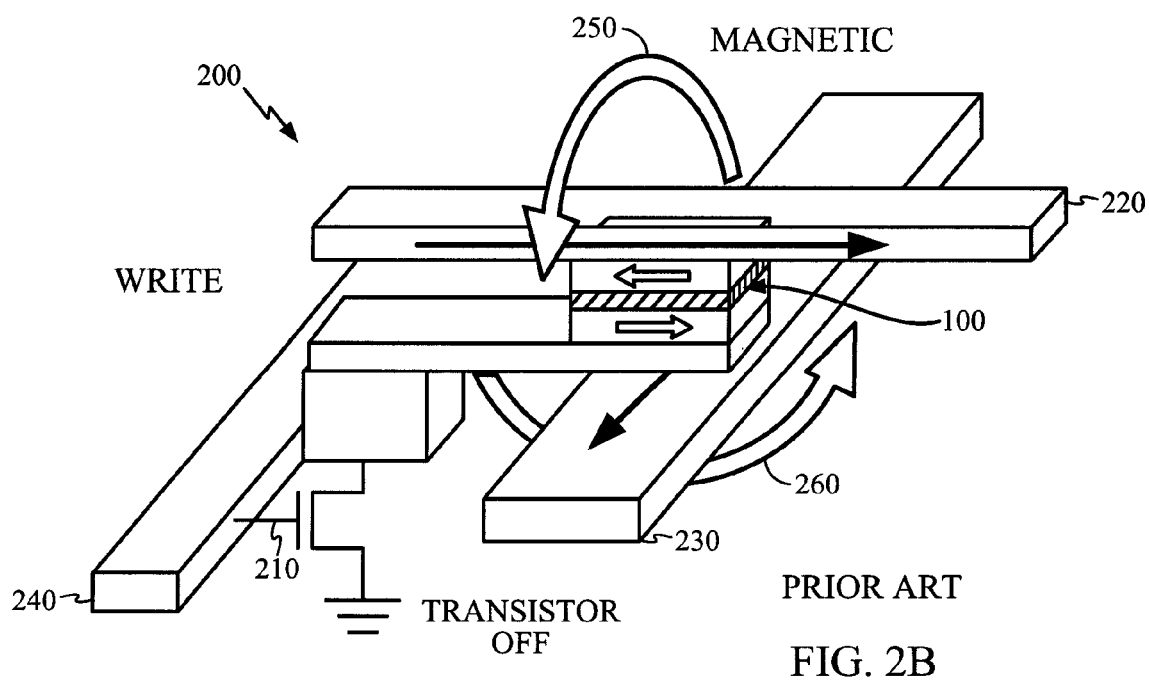
Figure 3A:
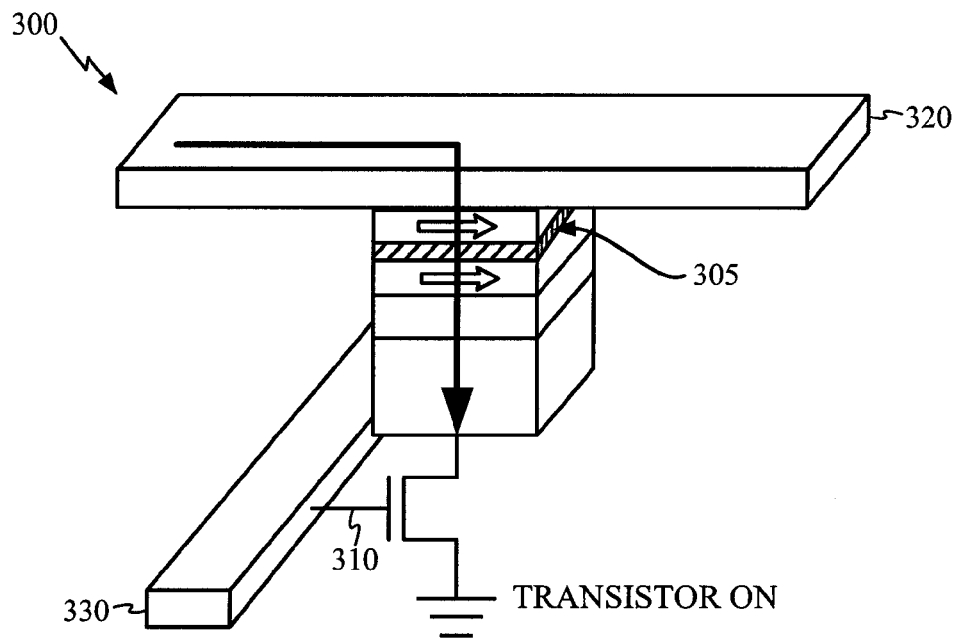
FIGS. 3A and 3B are illustrations of Spin Transfer Torque Magnetoresistive Random Access Memory (STT-MRAM) cells.
Figure 3B:
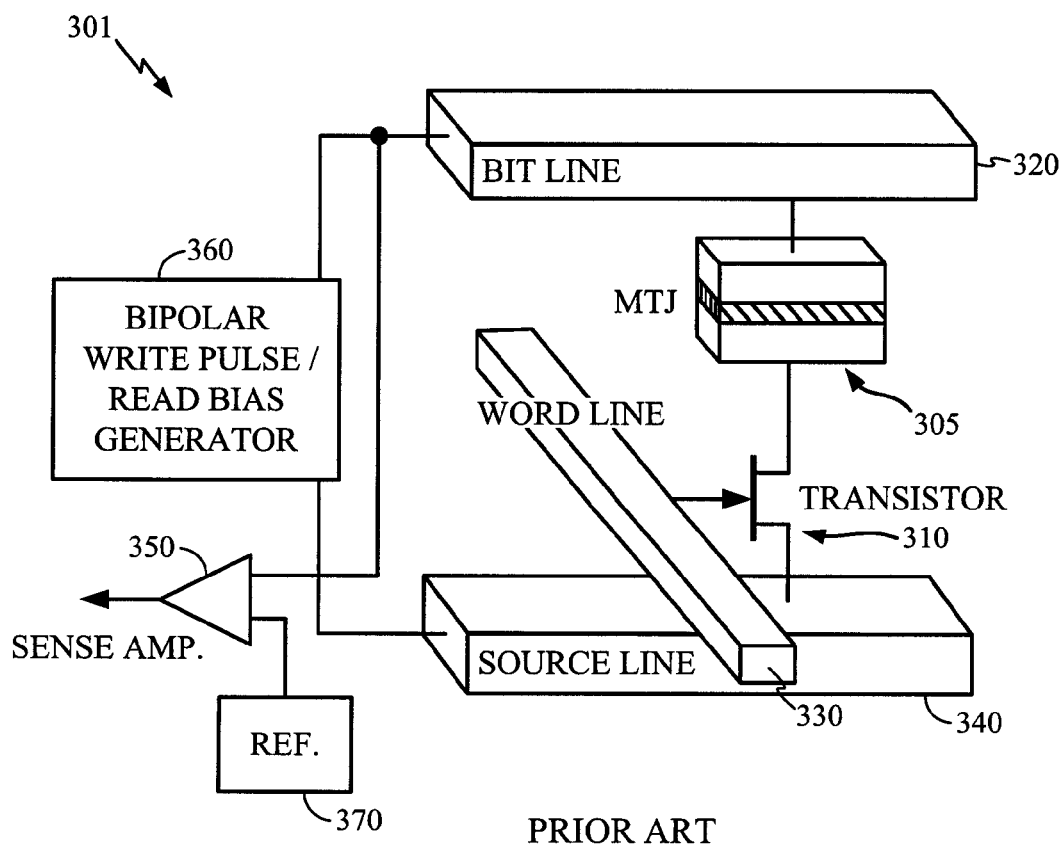
Figure 4A:
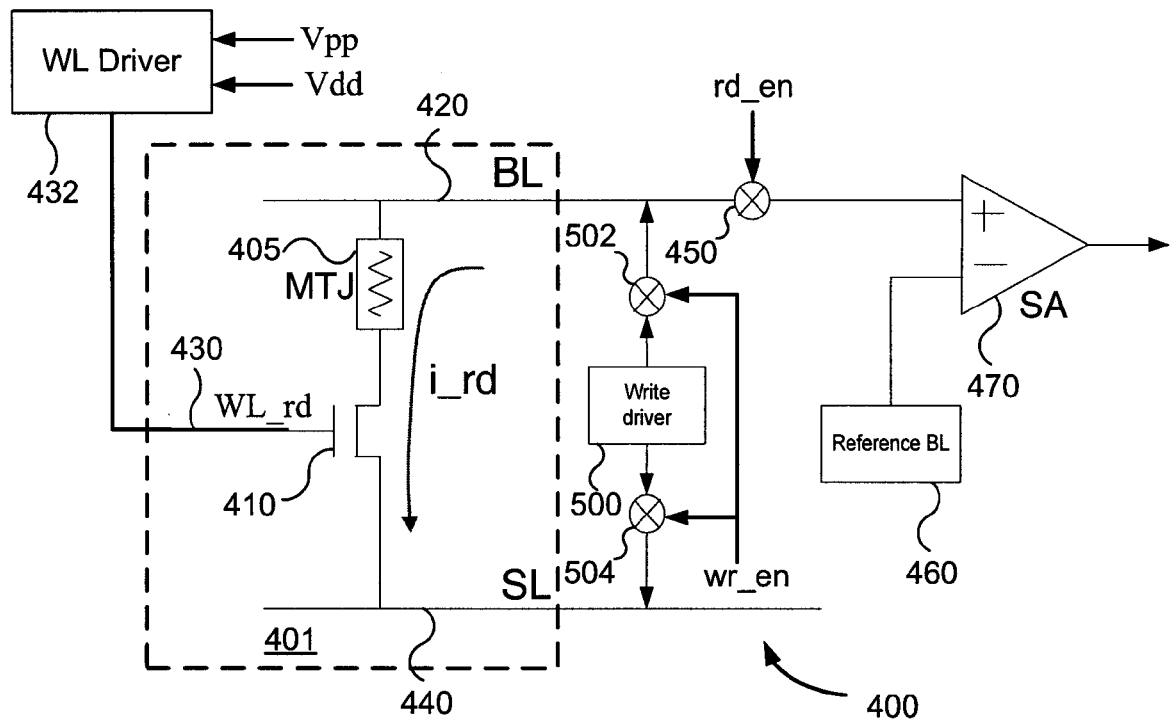
FIGS. 4A and 4B are illustrations of a circuit configuration in a STT-MRAM during read and write operations, respectively.

FIG. 4A illustrates a circuit configuration 400 in a STT-MRAM during a read operation. The circuit includes a bit cell 401 including a MTJ 405 and word line transistor 410 coupled between bit line (BL) 420 and source line (SL) 440. Further, the word line transistor 410 is coupled to word line 430, as discussed above. A read isolation element 450 is coupled to the bit line 420 to isolate sense amplifier 470 during a write operation. Element 450 (e.g., read mux) can be used to select one of the bit lines during read operation as well as providing sense amplifier isolation. As will be appreciated by those skilled in the art, read isolation element 450 can be any device or combination of devices that can couple the sense amplifier 470 to the bit line 420 during read operations and can isolate sense amplifier 470 during the write operations. For example, the isolation element 450 can be a transmission gate coupled in series with an input of sense amplifier 470. However, those skilled in the art will appreciate that other devices and/or combinations of devices such as multiplexers and the like may be used. Further, those skilled in the art will appreciate that the circuit configuration illustrated herein is merely to facilitate the description of aspects of embodiments of the invention and is not intended to limit the embodiments to the illustrated elements and/or arrangements.

Referring back to FIG. 4A, the isolation element 450 can receive a read enable signal (rd_en) to coordinate with the read operation. A sense amplifier 470 is coupled to the bit line 420 and to a reference 472. Sense amplifier 470 can be used to determine the state of the bit cell 401 by amplifying the voltage differential between the bit line 420 and the reference 472 at the input of the sense amplifier 470 during the read operation. During the read operation transistor 410 is conducting and a read current (i_rd) flows through the MTJ 405. The read isolation element 450 will be conducting and a voltage in proportion to the resistance of the MTJ 405 will be generated and detected at sense amplifier 470. As discussed above, the resistance will vary based on the logic state of the MTJ 405. Accordingly, the data stored in bit cell 401 can be read.

Figure 4B:
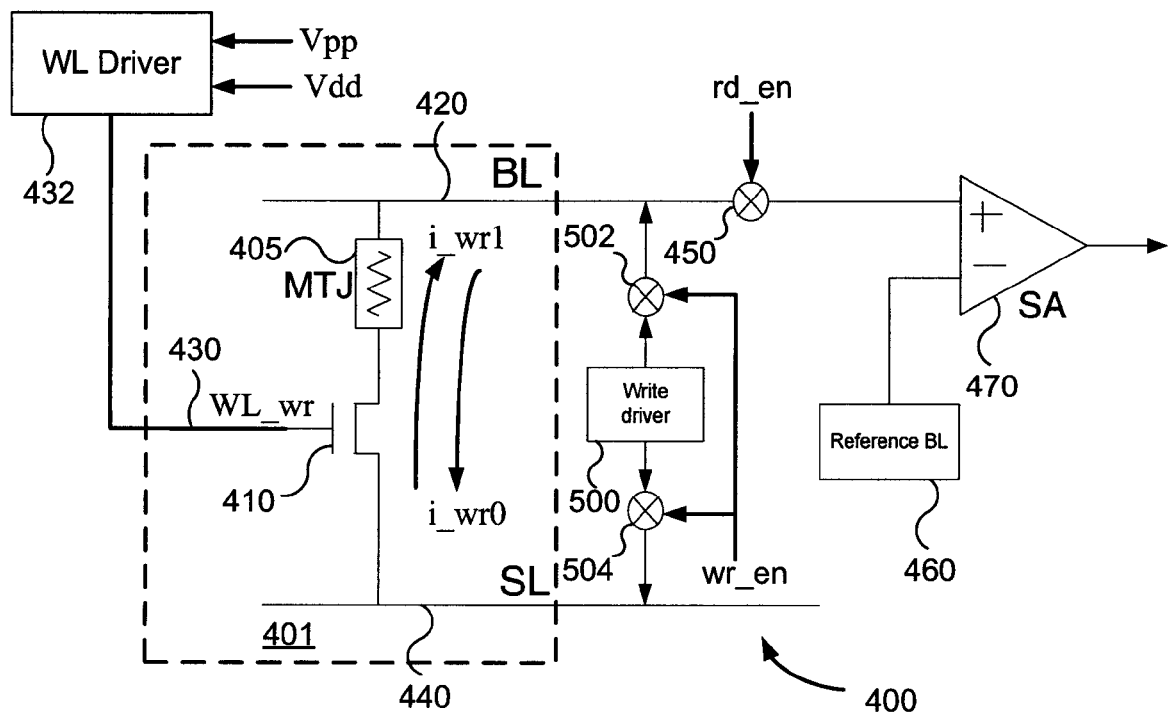

Word line driver 432 is coupled to the word line 430 and word line transistor 410. Word line driver 432 can selectively change the voltage applied to transistor 410 for the read and write operations. During the read operation, word line driver 432 provides word line 430 and transistor 410 with a second voltage (WL_rd) that can be, for example, the core voltage Vdd. Referring to FIG. 4B, during write operations, word line driver 432 provides word line 430 and transistor 410 with a first voltage (WL_wr) that is a higher voltage (e.g., Vpp) than the second voltage level (e.g., Vdd). For example, the word line driver 432 is illustrated as having two supply voltages, a lower voltage Vdd (e.g., a core voltage) and a higher voltage Vpp (e.g., a pumping voltage). Vdd can be at the same level as is supplied for the rest of the memory circuit (e.g., 1.2 V). For example, in some embodiments Vpp can be on the order of 40% to 100% greater than Vdd. However, embodiments of the invention are not limited to this range and Vpp can be substantially higher, if the increased voltage will not damage or degrade the reliability of wordline transistor 410 or other circuit elements. Vpp can be supplied from an integrated power source, such as from a power management integrated circuit or from other external supplies. Alternatively, Vpp can be generated from Vdd using a pumping circuit, for example, as is known in the art.

Figure 5:
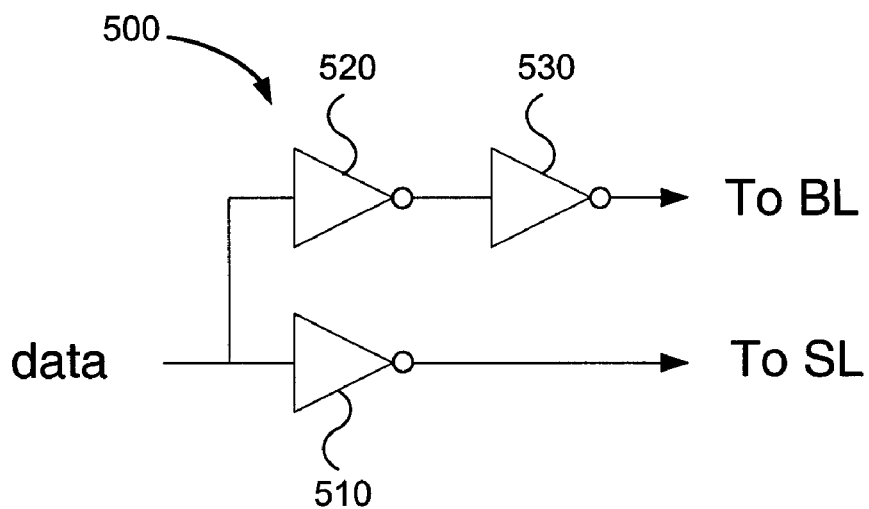
FIG. 5 is an illustration of a circuit configuration for a write driver for a STT-MRAM.

A write driver 500 and write isolation elements 502 and 504 are coupled between the bit line 420 and source line 440 to enable selection of a bit line and writing data to bit cell 401. As discussed above and illustrated in FIG. 4B, in a STT RAM passing current through the MTJ 405 can change the polarity of the free layer which in turn changes the resistance of the MTJ 405. This change of resistance can then be detected as a change of logic state of the bit cell 401. For example, a first write current (i_wr0) can flow in a first direction to write a "0" logic state. A second write current (i_wr1) can flow in a second direction opposite to the first direction to write a "1" logic state. The write isolation elements 502 and 504 can be any device or combination of devices that can selectively couple and decouple the write driver 500. For example, the write isolation elements 502 and 504 can be transmission gates coupled in series with the write driver 500. Further, the write isolation elements can receive a write enable signal (wr_en) to coordinate coupling the write driver 500 during the write operation. However, those skilled in the art will appreciate that the write isolation elements 502 and 504 can be other devices and/or combinations of devices such as multiplexers and the like, which can be used to achieve the same functionality. Referring to FIG. 5, a circuit configuration for write line driver 500 is illustrated. The write line driver 500 can include a plurality of inverters 510, 520 and 530 configured to differentially drive the bit line (BL) and source line (SL) based on a received data input that is to be written to the bit cell.

Figure 6:
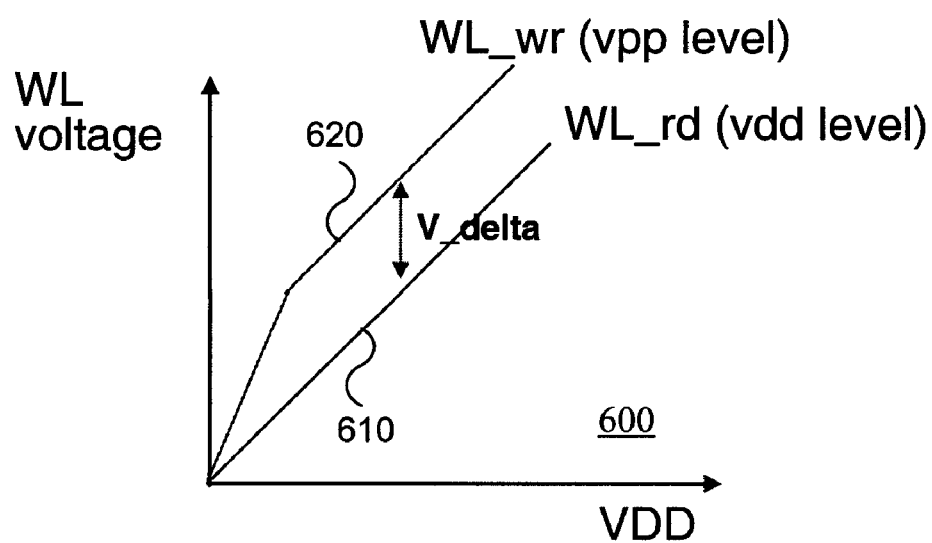
FIG. 6 is a graph illustrating the word line voltage for read and write operations of a STT-MRAM.

FIG. 6 is a graph 600 illustrating the word line voltage applied at the word line transistor for write and read operations for various values of Vdd. As illustrated, the word line read voltage (WL_rd) 610 can be Vdd. However, the word line write voltage (WL_wr) 620 is greater than WL_rd by a voltage differential V_delta. The higher write voltage can be used to increase the margin of the write threshold over the read. Accordingly, V_delta is proportional to this increased margin, so that an increase in V_delta results in an increase of the margin and a decrease in the potential for the read operation to cause an invalid write. As discussed above, WL_wr can be generated using a pumping voltage, internal supply voltage (e.g., in embedded applications) or external supply voltage that is greater than the core voltage. Accordingly, graph 600 is provided merely for the purpose of illustration and is not intended to limit the embodiments of the invention. For example, the write voltage (WL_wr) could be a fixed value so V_delta would be a decreasing function as Vdd increases. Alternatively, the write voltage (WL_wr) could be a multiple of Vdd (e.g., N*Vdd, where N is a fixed real number) and V_delta would be an increasing function as Vdd increased. However, regardless of the strategy for generating V_delta, as long as WL_wr is greater than WL_rd, a decrease in the potential for the read operation to cause an invalid write can be achieved.

As discussed in relation to FIG. 4, the word line driver 432 is configured to selectively supply the word line with different voltage levels for write and read operations. The word line driver 432 can include logic to select the second (lower) voltage level for read operations and the first (higher) voltage level for write operations. For example, in a dual supply configuration the word line driver 432 can include a switching element to select the first and second voltages. The switching element may include transistors, transmission gates, multiplexers, or any other device that can select the first and second voltages, as will be appreciated by those skilled in the art. If a single supply is used, a pumping circuit may be included in word line driver 432 and selectively enabled for the write operations. Accordingly, those skilled in the art will appreciate that many configurations can be used for word line driver 432 and that embodiments of the invention are not limited to the illustrated and discussed examples provided herein.

Figure 7:
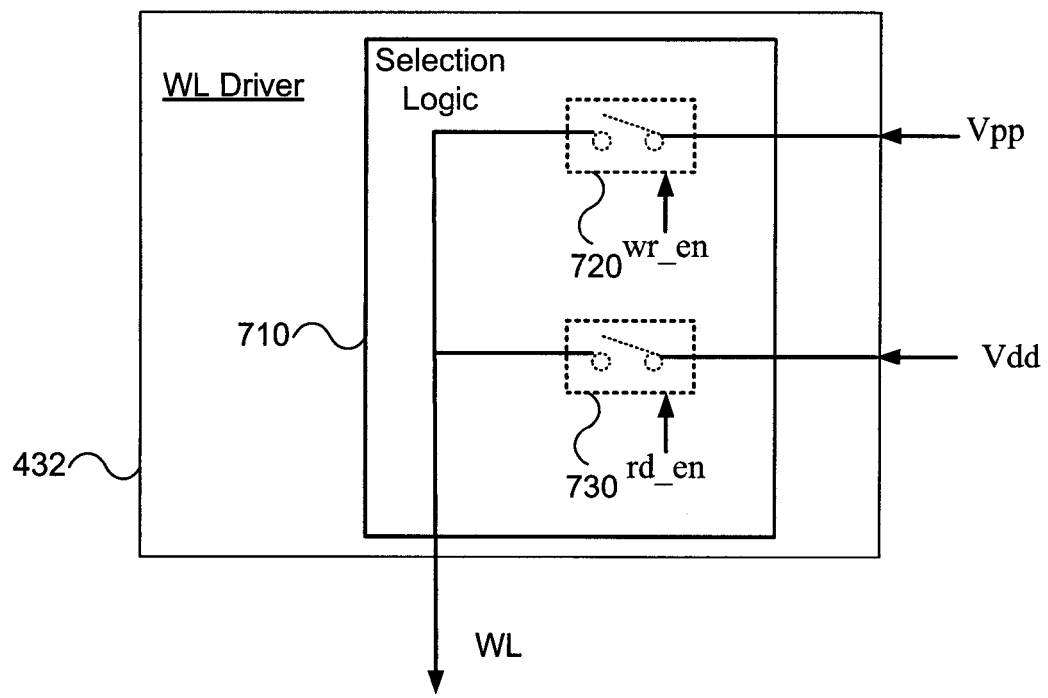
FIG. 7 is a block diagram of a word line driver including selection logic to select first and second voltages for the word line.

For example, referring to FIG. 7, a block diagram of the word line (WL) driver 432 is illustrated. The word line driver 432 can include selection logic 710 configured to select the first voltage (e.g. Vpp) for write operations and the second voltage (Vdd) for read operations. As illustrated, the selection logic 710 includes controlled switching devices 720 and 730 for selecting the first and second voltages in response to a write enable signal (wr_en) and a read enable signal (rd_en), respectively. As discussed herein it will be appreciated that the switching devices need not be any particular device or configuration, as long as the functionality of providing a higher voltage during the write operation is achieved. Further, if a pumping circuit is used it may be incorporated in the word line driver 432 and selectively enabled and disabled. Accordingly, the configurations provided herein are merely for illustration and not limitation of embodiments of the invention.

Figure 8:
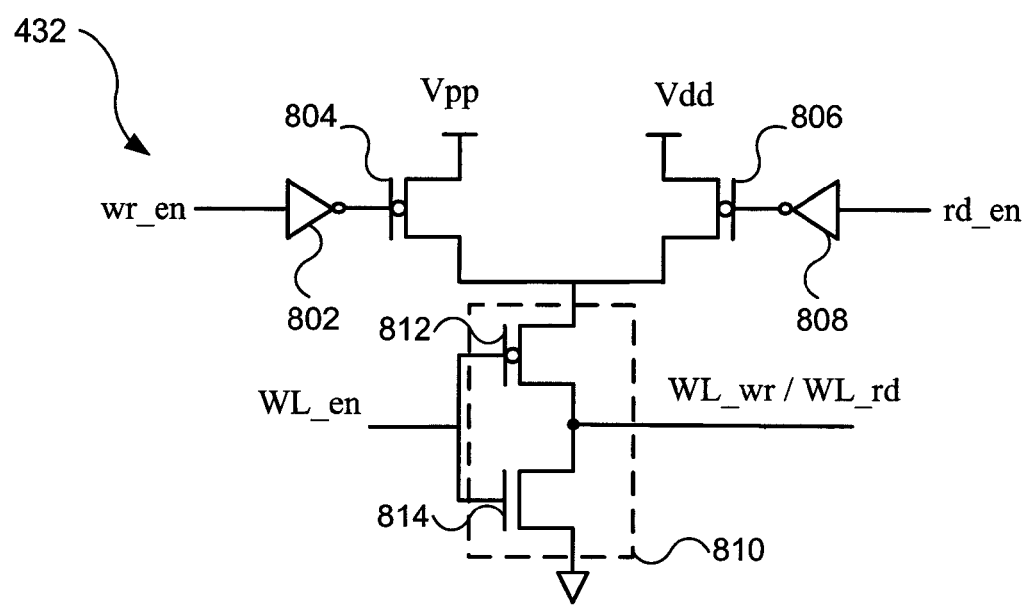
FIG. 8 is an illustration of a circuit configuration for a word line driver for a STT-MRAM.

FIG. 8 illustrates a circuit diagram of the word line (WL) driver 432 according to another embodiment of the invention. The first voltage (e.g. Vpp) for write operations is provided to a driver circuit 810 by transistor 804 which is activated in response to a write enable signal (wr_en) buffered by inverter 802. The second voltage (Vdd) for read operations is provided to driver circuit 810 by transistor 806 which is activated in response to a read enable signal (rd_en) buffered by inverter 808. Driver 810 includes transistors 812 and 814 couple to the word line (WL). Driver 810 is also selectively enabled by the word line enable (WL_en) signal. Accordingly, if the write enable signal is activated (in this case a high logic state signal), transistor 804 is switched on and the first voltage (e.g., Vpp) is provided to driver 810. Upon activation of the word line enable signal (in this case a low logic state signal) for the write operation, the driver circuit 810 will turn on and provide Vpp (WL_wr voltage) to the word line. Similarly, upon activation of the read enable (rd_en) signal (in this case a high logic state signal), transistor 806 is switched on and the second voltage (e.g. Vdd) is provided to driver 810. Upon activation of the word line enable (in this case a low logic state signal) for the read operation, the driver circuit 810 will turn on and provide Vdd (WL_rd voltage) to the word line.

In view of the foregoing, it will be appreciated that embodiments of the invention can also include methods for performing the functions, sequence of actions and/or algorithms described herein. For example, an embodiment of the invention can include a method for read and write operations in a Spin Transfer Torque Magnetoresistive Random Access Memory (STT-MRAM) device including applying a first voltage to a word line transistor of a bit cell during a write operation; and applying a second voltage to the word line transistor during a read operation, wherein the first voltage is higher than the second voltage. The method can further include generating the first voltage by pumping a common voltage source, wherein the common voltage source is used for the second voltage. Alternatively, as discussed above, the first voltage and the second voltage may each be provided from separate power sources. Methods according to embodiments of the invention can further include selecting the first voltage in response to a write enable signal and selecting the second voltage in response to a read enable signal. Still further methods can include supplying a first voltage to word line in response to a word line enable signal during a write operation and the second voltage to the word line in response to the word line enable signal during the read operation. Accordingly, it will be appreciated that any of the alternative functionalities describe herein may further be included in methods of embodiments of the invention.

While the foregoing disclosure shows illustrative embodiments of the invention, it should be noted that various changes and modifications could be made herein without departing from the scope of embodiments of the invention as defined by the appended claims. For example, specific logic signals corresponding to the transistors/circuits to be activated, may be changed as appropriate to achieve the disclosed functionality as the transistors/circuits may be modified to complementary devices (e.g., interchanging PMOS and NMOS devices). Likewise, the functions, steps and/or actions of the methods in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A Spin Transfer Torque Magnetoresistive Random Access Memory (STT-MRAM) comprising:
   a bit cell having a magnetic tunnel junction (MTJ) and a word line transistor, wherein the bit cell is coupled to a bit line and a source line; and
   a word line driver coupled to a gate of the word line transistor, wherein the word line driver is configured to provide a first voltage for a write operation; and a second voltage during a read operation, and wherein the first voltage is higher than the second voltage.

2. The STT-MRAM of claim 1, further comprising:
   a read isolation element interposed between the bit cell and a sense amplifier, wherein the isolation element is configured to selectively isolate the sense amplifier from the bit line during a write operation.

3. The STT-MRAM of claim 2, wherein the read isolation element is at least one of a switch, a transmission gate, or a multiplexer.

4. The STT-MRAM of claim 1, further comprising:
   a write driver configured to provide an electrical signal to the bit cell to store a logic state in the bit cell; and
   at least one write isolation element coupled in series with the write driver between the bit line and source line, wherein the write isolation element is configured to isolate the write driver during a read operation.

5. The STT-MRAM of claim 4, wherein the write driver comprises:
   first and second inverters coupled in series between a data input and the bit line; and
   a third inverter coupled in series between the data input and the source line.

6. The STT-MRAM of claim 1, wherein the word line driver further comprises:
   selection logic configured to select the first voltage for write operations and the second voltage for read operations.

7. The STT-MRAM of claim 6, wherein the selection logic comprises:
   a first switching device coupled to the first voltage; and
   a second switching device couple to the second voltage.

8. The STT-MRAM of claim 6, wherein the selection logic comprises:
   a first selection transistor coupled to the first voltage configured to switch on in response to a write enable signal;
   a second selection transistor coupled to the second voltage configured to switch on in response to a read enable signal; and
   a driver circuit coupled to the first and second selection transistors and configured to output the first voltage to the word line in response to a word line enable signal during a write operation and to output the second voltage to the word line in response to the word line enable signal during a read operation.

9. The STT-MRAM of claim 1, wherein the first voltage and the second voltage are provided from a common power source.

10. The STT-MRAM of claim 9, further comprising:
    a voltage pump circuit configured to generate the first voltage from the common power source.

11. The STT-MRAM of claim 1, wherein the first voltage and the second voltage are each provided from separate power sources.

12. The STT-MRAM of claim 1, wherein the first voltage is about 40% to 100% higher than the second voltage.

13. The STT-MRAM of claim 1, wherein the first voltage in the write operation and second voltage in the read operation are applied to the gate of the word line transistor.

14. A method for read and write operations in a Spin Transfer Torque Magnetoresistive Random Access Memory (STT-MRAM) comprising:
    applying a first voltage to a gate of a word line transistor of a bit cell during a write operation; and
    applying a second voltage to the word line transistor during a read operation, wherein the first voltage is higher than the second voltage.

15. The method of claim 14, further comprising:
    generating the first voltage by pumping a common voltage source, wherein the common voltage source is used for the second voltage.

16. The method of claim 14, wherein the first voltage and the second voltage are each provided from separate power sources.

17. The method of claim 14, further comprising:
isolating a sense amplifier from the bit cell during the write operation.

18. The method of claim 17, wherein an isolation element used to isolate the sense amplifier is at least one of a switch, a transmission gate, or a multiplexer.

19. The method of claim 14, wherein the bit cell comprises:
a magnetic tunnel junction (MTJ) and wherein the word line transistor is coupled in series with the MTJ.

20. The method of claim 14, further comprising:
selecting the first voltage in response to a write enable signal; and
selecting the second voltage in response to a read enable signal.

21. The method of claim 20, further comprising:
supplying the first voltage to a word line in response to a word line enable signal during a write operation and the second voltage to the word line in response to the word line enable signal during the read operation.

22. An apparatus for read and write operations in a Spin Transfer Torque Magnetoresistive Random Access Memory (STT-MRAM) comprising:
means for applying a first voltage to a gate of a word line transistor of a bit cell during a write operation; and
means for applying a second voltage to the word line transistor during a read operation, wherein the first voltage is higher than the second voltage.

23. The apparatus of claim 22, further comprising:
means for generating the first voltage by pumping a common voltage source, wherein the common voltage source is used for the second voltage.

24. The apparatus of claim 22, wherein the first voltage and the second voltage are each provided from separate power sources.

25. The apparatus of claim 22, further comprising:
means for isolating a sense amplifier from the bit cell during the write operation.

26. The apparatus of claim 25, wherein the means for isolating is at least one of a switch, a transmission gate, or a multiplexer.

27. The apparatus of claim 22, wherein the bit cell comprises:
a magnetic tunnel junction (MTJ) and wherein the word line transistor is coupled in series with the MTJ.

28. The apparatus of claim 22, further comprising:
means for selecting the first voltage in response to a write enable signal; and
means for selecting the second voltage in response to a read enable signal.

29. The apparatus of claim 28, further comprising:
means for supplying the first voltage to a word line in response to a word line enable signal during a write operation and the second voltage to the word line in response to the word line enable signal during the read operation.

* * * * *

UNITED STATES PATENT AND TRADEMARK OFFICE
CERTIFICATE OF CORRECTION

| | | |
|---|---|---|
| PATENT NO. | : 7,742,329 B2 | Page 1 of 1 |
| APPLICATION NO. | : 11/770839 | |
| DATED | : June 22, 2010 | |
| INVENTOR(S) | : Yoon et al. | |

It is certified that error appears in the above-identified patent and that said Letters Patent is hereby corrected as shown below:

Column 8, line 25, claim 7: "couple to" to read as --coupled to--

Signed and Sealed this
Fourteenth Day of June, 2011

David J. Kappos
*Director of the United States Patent and Trademark Office*